United States Patent [19]

Satoh

[11] Patent Number: 4,975,775
[45] Date of Patent: Dec. 4, 1990

[54] TUNER FOR RECEIVING TELEVISION SIGNAL IN FREQUENCY DIVISION MULTIPLEX SYSTEM AND TELEVISION SIGNAL IN TIME DIVISION MULTIPLEX SYSTEM

[75] Inventor: Ken Satoh, Kashiwa, Japan

[73] Assignee: Sharp Kabushiki Kaisha, Osaka, Japan

[21] Appl. No.: 271,322

[22] Filed: Nov. 15, 1988

[30] Foreign Application Priority Data

Nov. 19, 1987 [JP] Japan ................... 62-292697

[51] Int. Cl.⁵ .................... H04N 5/46; H04N 5/60
[52] U.S. Cl. ..................... 358/198; 358/143; 358/191.1; 358/195.1
[58] Field of Search ............... 358/140, 141, 142, 147, 358/12, 13, 191.1, 193.1, 197, 188, 198

[56] References Cited

U.S. PATENT DOCUMENTS

| | | | |
|---|---|---|---|
| 3,859,458 | 1/1975 | Takezawa | 358/143 |
| 4,800,426 | 1/1989 | Glenn | 358/191.1 |

FOREIGN PATENT DOCUMENTS

| | | |
|---|---|---|
| 317360 | 5/1989 | European Pat. Off. |
| 2592543 | 7/1987 | France |
| 233691 | 3/1988 | Japan |
| 149686 | 6/1989 | Japan |

Primary Examiner—Tommy P. Chin

[57] ABSTRACT

A tuner for use in two systems utilizes a determining circuit to determine whether or not a baseband signal, after demodulation includes a sound carrier. If a sound carrier is present, the determining circuit determines that the received television signal is a television signal in the NTSC system, if the carrier signal is not present, a television signal in the MUSE system. When the received television signal is a television signal in the NTSC system, switches are activated such that the baseband signal is applied to a signal processing circuit for video and a signal processing circuit compatible with the NTSC system. An averaging AFC is selected by these switches. On the other hand, when the received television is a television signal in the MUSE system, switches are activated such that the baseband signal is applied to a MUSE decoder and a keyed AFC is selected.

23 Claims, 4 Drawing Sheets

PRIOR ART

TUNER FOR RECEIVING TELEVISION SIGNAL IN FREQUENCY DIVISION MULTIPLEX SYSTEM AND TELEVISION SIGNAL IN TIME DIVISION MULTIPLEX SYSTEM

BACKGROUND OF THE INVENTION

1. Field of the Invention

The present invention relates generally to a tuner used in a television receiver, and more particularly, to a tuner for use in two systems (referred to as two-system tuner below) used in a television receiver capable of receiving a television signal in which sound information is multiplexed on video information in a frequency-divisional manner using a carrier and a television signal in which sound information and video information are multiplexed in a time-divisional manner.

2. Background Art

A television signal in a conventionally known standard system is a television signal in which sound information, video information and the like are multiplexed in a frequency-divisional manner. More specifically, a sound information is multiplexed on the video information in a frequency-divisional manner using a sound carrier. A typical television standard system includes three types: NTSC (National Television System Committee) system, PAL (Phase Alternation by Line) system and SECAM (Sequential Couleur A Memoire) system.

Figure 1:
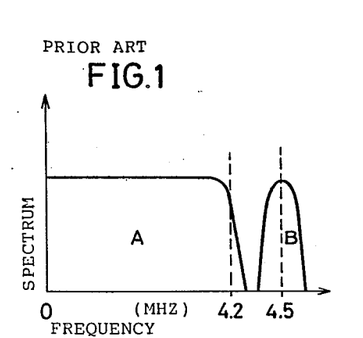
FIG. 1 is a diagram showing the relation between the frequency and the amplitude of a television signal in the NTSC system.
Figure 2:
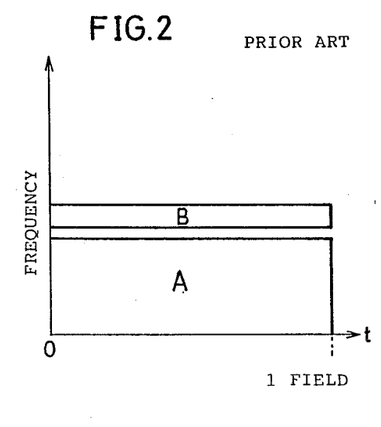
FIG. 2 is a diagram showing the relation between the frequency and the time of the television signal in the NTSC system.

In the case of the NTSC system, sound information B is multiplexed on video information A in a frequency-divisional manner using a sound carrier signal in order to avoid superposition of an occupied frequency band of the video information A and an occupied frequency band of the sound information B as shown in FIGS. 1 and 2.

Figure 3:
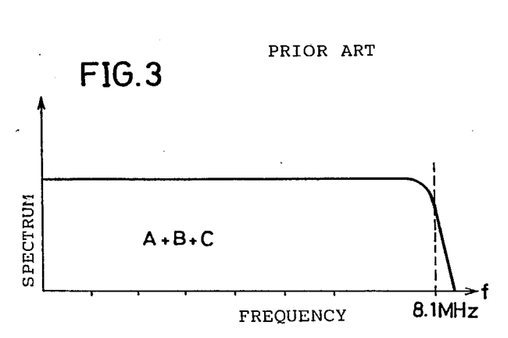
FIG. 3 a diagram showing the relation between the frequency and the amplitude of a television signal in the MUSE system.
Figure 4:
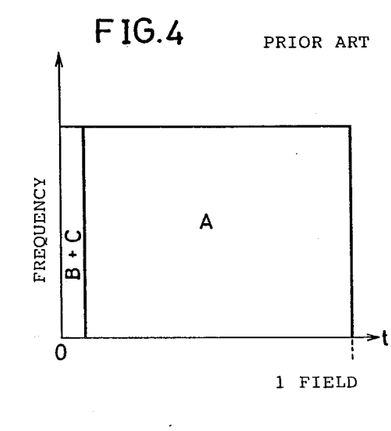
FIG. 4 is a diagram showing the relation between the frequency and the time of the television signal in the MUSE system.

On the other hand, a time division multiplex system for a high definition television has been developed in which sound information and video information are multiplexed in a time-divisional manner, thereby overcoming the disadvantages in the television standard system. This time division multiplex system includes the MUSE (Multiple Subnyquist Sampling Encoding) system and the MAC (Multiplexed Analogue Component) system. In the case of the MUSE system, occupied frequency bands of video information A, sound information B and control data C are superimposed, as shown in FIG. 3. In addition, in a television signal in the MUSE system, the sound information B and the control data C, and the video information A exist in a divided state on the time base in one field, as shown in FIG. 4.

As described in the foregoing, since the structure of the television signal in the standard system and the structure of the television signal in the time division multiplex system are entirely different from each other, the television signal in the standard system and the television signal in the time division multiplex system do not generally use a common transmission channel.

Recently, using satellite broadcasting of a 12 (GHZ) band in Japan, an experiment was performed in which television signals in two different systems, for example, a television signal in the NTSC system and a television signal in the MUSE system were transmitted using a common transmission channel. Therefore, in the near future, it may be that one transmission channel is going to share the television signals of different systems in regular use.

If and when one transmission channel is shared by the television signals in the two systems, it will be necessary to perform processing of, for example, changing the bandwidth of a demodulation signal in accordance with the system of a received television signal and changing signal processing after demodulation. Therefore, more specifically, a control system such as a signal processing circuit in a stage succeeding to a demodulator and an AFC (Automatic Frequency Control) circuit for automatically controlling the frequency of the signal and keeping the same constant must be switched in accordance with the system of the received television signal.

Figure 5:
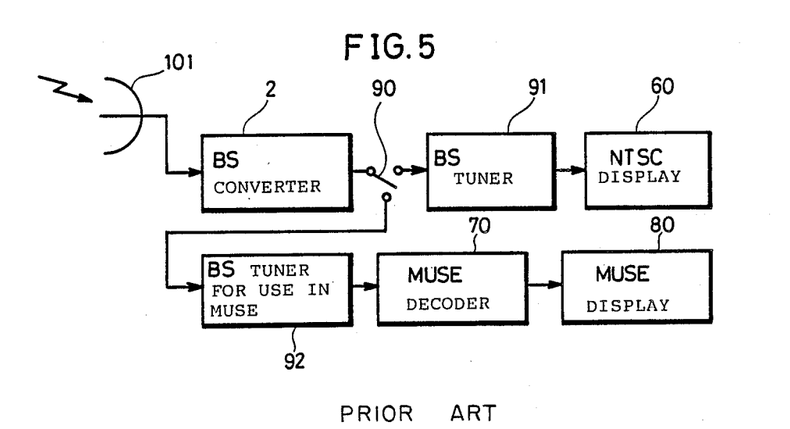
FIG. 5 is a system block diagram showing one example of a television receiver, which receives television signals in two, different systems in the same transmission channel using two conventional tuners.

In such a case, it is considered that independent tuners will be separately employed for the respective systems. More specifically, if and when television signals in different systems using a common transmission channel are received, a television signal received by an antenna 101 is sent to a BS tuner 91 or 92 corresponding to the system of the received television signal by way of a converter for satellite broadcasting (referred to as BS converter below) 2, as shown in FIG. 5. A video signal and a sound signal outputted from the BS tuner 91 are applied to an NTSC display 60. In addition, a baseband signal outputted from the BS tuner 92 for MUSE is applied to a decoder for an MUSE signal (referred to as MUSE decoder below) 70. A video signal and a sound signal outputted from the MUSE decoder 70 are applied to an MUSE display 80.

In this case, an operator must visually determine the system of the received television signal by observing a signal waveform using an oscilloscope or the like. In addition, after visually determining the system of the television signal, the operator must select the BS tuner 91 or 92 corresponding to the system and manually switch a switching switch 90 for transmitting the television signal to the selected BS tuner. Thus, the operator must do the above described work which is complicated, every time the television signal is received.

In the above described case, the determination of the system of the received television signal is not reliable because it depends on visual determination of the operator. Furthermore, a tuner for satellite broadcasting is expensive. Therefore, if tuners corresponding to the two different systems are provided in a television receiver in order to allow the television signals in the systems to be received, the television receiver becomes very expensive, so that it is difficult to put the television in commercial use because of the cost.

SUMMARY OF THE INVENTION

An object of the present invention is to provide one tuner for use with a television signal that is capable of receiving two different systems, television signals in two different systems by one tuner.

Another object of the present invention is to provide a low-cost tuner capable of receiving a television signal in a frequency division multiplex system and a television signal in a time division multiplex system.

Still another object of the present invention is to provide a tuner for use in two systems capable of automatically performing signal processing corresponding to a received television signal in accordance with the system of the television signal and having a simple structure.

In order to attain the above described objects, the present invention is directed to a tuner capable of receiving a first television signal in which a sound signal is multiplexed on a video signal in a frequency-divisional manner using a carrier and a second television signal in which a sound signal and a video signal are multiplexed in a time-divisional manner. The tuner includes first signal processing means, second signal processing means, determining means and switching means. The first signal processing means signal-processes the first television signal, to detect the sound signal and the video signal of the first television signal. The second signal processing means signal-processes the second television signal, to detect the sound signal and the video signal of the second television signal. The determining means determines whether or not the received television signal includes the carrier. The switching means applies the received television signal to the first signal processing means in response to the determination by the determining means that the received television signal includes the carrier while applying the received television signal to the second signal processing means in response to the determination by the determining means that the received television signal does not include the carrier.

In the tuner according to the present invention, the received signal is applied to the determining means. In the determining means, the presence or absence of the carrier is determined, so that it is determined whether the received television signal is a television signal in the frequency division multiplex system or a television signal in the time division multiplex system.

When the carrier is included in the received television signal, it is determined that the received television signal is a television signal in the frequency division multiplex system. In this case, the received television signal is applied to the first signal processing means by the switching means in response to an output of the determining means. In the first signal processing means, the received television signal is processed in a predetermined manner, so that the sound signal and the video signal are detected.

On the other hand, when the carrier is not included in the received television signal, it is determined that the received television signal is a television signal in the time division multiplex system. In this case, the received television signal is applied to the second signal processing means by the switching means in response to the output of the determining means. In the second signal processing means, the received television signal is processed in a predetermined manner, so that the sound signal and the video signal are detected.

In accordance with another aspect of the present invention, the tuner further includes first automatic frequency adjusting means and second automatic frequency adjusting means. The first automatic frequency adjusting means maintains the frequency of the first television signal. The second automatic frequency adjusting means maintains the frequency of the second television signal. The first automatic frequency adjusting means is operated in response to the determination by the determining means that the received television signal includes the carrier. The second automatic frequency adjusting means is operated in response to the determination by the determining means that the received television signal does not include the carrier.

Thus, when it is determined that the received television signal is a television signal in the frequency division multiplex system, the frequency of the received television signal is maintained constant by the first automatic frequency adjusting means. In addition, when it is determined that the received television signal is a television signal in the time division multiplex system, the frequency of the received television signal is maintained constant by the second automatic frequency adjusting means.

As described above according to the present invention, the system of the received television signal is easily determined by determining the presence or absence of the carrier, so that the signal processing means corresponding to the determined system can be automatically selected. Therefore, the television signals in the two different systems can be received by one tuner. As a result, the cost of the television receiver capable of receiving the television signals in the two systems can be reduced.

Thus, the tuner for use in two systems according to the present invention can be applied with good results to a television receiver capable of receiving the television signals in the different systems.

The above and other objects, features, aspects and advantages of the present invention will become more apparent from the following detailed description of the present invention when taken in conjunction with the accompanying drawings.

DESCRIPTION OF THE PREFERRED EMBODIMENTS

Referring now to the figures, a preferred embodiment of the present invention will be described in detail.

Figure 6:
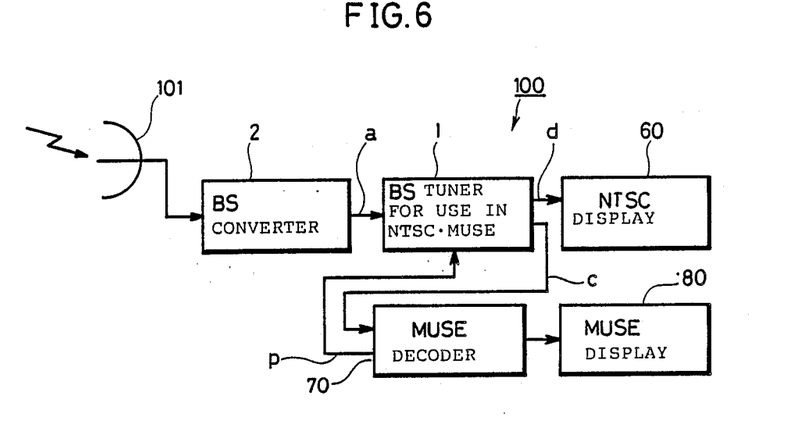
FIG. 6 is a system block diagram showing a structure of a television receiver using a two-system tuner according to one embodiment of the present invention.

A television receiver 100 shown in FIG. 6 comprises a two-system BS tuner 1, a BS converter 2, an NTSC display 60, an MUSE decoder 70 and an MUSE display 80. The BS tuner 1 can receive a television signal in the NTSC system as a television signal in a standard system and a television signal in the MUSE system as a television signal in a time division multiplex system, respectively.

In FIG. 6, a television signal received by a parabolic antenna 101 is converted into a first intermediate frequency signal (referred to as first IF signal below) "a" in the BS converter 2. This first IF signal "a" is applied to the two-system tuner 1 according to the present embodiment. When the received television signal is a television signal in the NTSC system, a video signal "d" obtained by signal processing in the tuner 1 is sent to the NTSC display 60. In addition, when the received television signal is a television signal in the MUSE system, a baseband signal "c" outputted from the tuner 1 is applied to the MUSE decoder 70. A video signal obtained by signal processing in the MUSE decoder 70 is send to the MUSE display 80.

Figure 7:
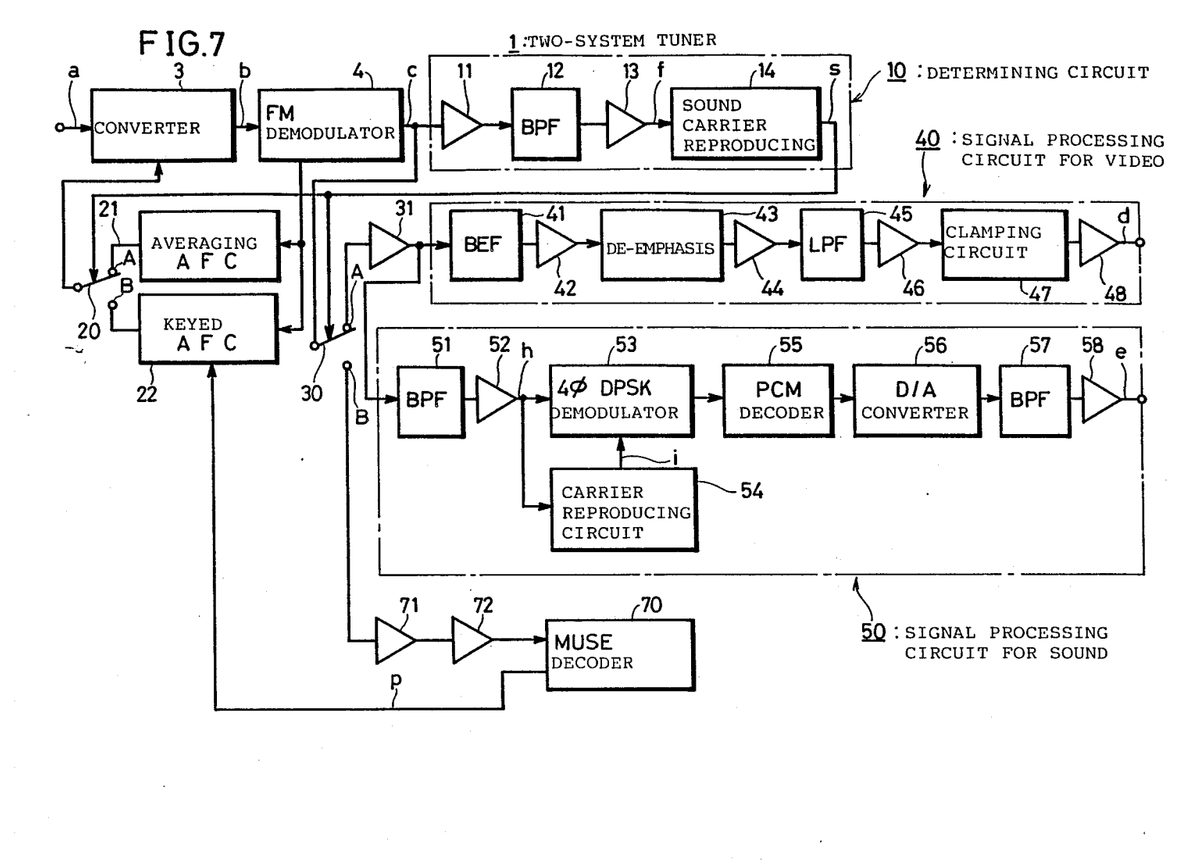
FIG. 7 is a system block diagram showing a structure of the two-system tuner according to one embodiment of the present invention.

Referring to FIG. 7, description is made of a structure of the two-system tuner 1 which is applied to the above described television receiver 100.

This two-system tuner 1 comprises a converter 3, an FM demodulator 4, a determining circuit 10, an AFC circuit switching switch 20, an averaging AFC circuit (Automatic Control) 21, a keyed AFC circuit 22, a signal processing circuit switching switch 30, a signal processing circuit 40 for video, a signal processing circuit 50 for sound, an MUSE decoder 70, and amplifiers 31, 71 and 72.

In the BS converter 2 shown in FIG. 6, the received television signal is converted into a first IF signal "a" and then, the first IF signal "a" is supplied to the two-system tuner 1. The converter 3, as shown in FIG. 7, frequency-converts the supplied first IF signal "a" into a second intermediate frequency signal (referred to as second IF signal below) "b" by channel selection, to apply the same to the FM demodulator 4. The converter 3 comprises a local oscillator and a mixer. The FM demodulator 4 demodulates the second IF signal "b" to a baseband signal "c", to apply the same to the determining circuit 10 and the switch 30.

The determining circuit 10 comprises amplifiers 11 and 13, a bandpass filter 12 for sound and a sound subcarrier reproducing apparatus 14. The baseband signal "c" amplified by the amplifier 11 is applied to the bandpass filter 12 for sound. The bandpass filter 12 for sound is a bandpass filter passing only a 4-phase differential phase modulation signal (referred to as 4 $\phi$ DPSK signal below) including a sound carrier. The sound carrier reproducing apparatus 14 comprises an out-of-synchronization detecting circuit. This out-of-synchronization detecting circuit detects the fact that a predetermined synchronizing signal is not synchronized with the 4 $\phi$ DPSK signal "f" outputted from the amplifier 13. When the out-of-synchronization detecting circuit does not detect out-of-synchronization, it is determined that the sound carrier exists in the received television signal. In this case, it is determined that the received television signal is a television signal in the NTSC system, so that corresponding processing is performed. On the contrary, when the out-of-synchronization detecting circuit detects out-of-synchronization, it is determined that the sound carrier does not exist in the received television signal. In this case, it is determined that the received television signal is a television signal in the MUSE system, so that corresponding processing is performed.

A determination signal "s" is outputted from the sound carrier reproducing apparatus 14 depending on whether the received television signal is a television signal in the NTSC system or a television signal in the MUSE system. The determination signal "s" outputted from the sound carrier reproducing apparatus 14 is applied to the switch 20 and the switch 30 as a control signal.

On the other hand, the baseband signal "c" from the FM demodulator 4 is applied to the averaging AFC 21 and the keyed AFC 22. A control signal outputted from the averaging AFC 21 and a control signal outputted from the keyed AFC 22 are selectively applied to the converter 3 through terminals A and B of the switch 20, respectively. The averaging AFC 21 and the keyed AFC 22 serve to maintain the frequency of the second IF signal "b" constant. Meanwhile, in the television signal in the NTSC system, a low frequency region is not important as information, so the averaging AFC is used. On the contrary, in the television signal in the MUSE system, the low frequency region is important as information, so that the keyed AFC is used. The keyed AFC 22 is responsive to a key pulse (timing signal) "p" applied from the MUSE decoder 70 for performing a frequency control operation only during a clamping period which exists within a vertical blanking period of the television signal in the MUSE system. The switch 20 is selectively switched to the side of the terminal A or B in response to the determination signal "s" outputted from the determining circuit 10.

Additionally, the switch 30 is selectively switched to the side of a terminal A or B in response to the determination signal "s" outputted from the determining circuit 10. Thus, when the received television signal is a television signal in the NTSC system, the baseband signal "c" is respectively applied to the signal processing circuit 40 for video and the signal processing circuit 50 for sound through the amplifier 31. On the other hand, when the received television signal is a television signal in the MUSE system, the baseband signal "c" is applied to the MUSE decoder 70 through the amplifiers 71 and 72.

The signal processing circuit 40 for video comprises a sound suppressing filter (BEF) 41, amplifiers 42, 44, 46 and 48, a de-emphasis circuit 43, a low-pass filter 45 for video and a clamping circuit 47. In the sound suppressing filter 41, a frequency region corresponding to a sound signal in the baseband signal "c" is removed. In the de-emphasis circuit 4, the level of a signal in a high frequency region is lowered. In the clamping circuit 47, the level of the signal is fixed at a constant DC level. In the above described manner, a video signal "d" is outputted from the amplifier 48.

The signal processing circuit 50 for sound comprises a bandpass filter 51 for sound, amplifiers 52 and 58, a 4-phase differential phase demodulator (referred to as 4 $\phi$ DPSK demodulator below) 53, a sound carrier reproducing circuit 54, a PCM decoder 55, a D-A converter 56 and a bandpass filter 57 for sound. In the bandpass filter 51 for sound, only the sound signal in the baseband signal "c" is passed. An output signal "h" from the amplifier 52 is applied to the 4 $\phi$ DPSK demodulator 53 and the sound carrier reproducing circuit 54. In the sound carrier reproducing circuit 54, a sound carrier signal "i" is extracted from the sound signal in the baseband, to be applied to the 4 $\phi$ DPSK demodulator 53. In the 4 $\phi$ DPSK demodulator 53, the sound signal "h" in the baseband is demodulated to a digital code using the sound carrier signal "i". In the PCM decoder 55, the digital code is converted into a digital signal corresponding to sound. In the D-A converter 56, the digital signal is converted into an analogue sound signal, to be outputted as a sound signal "e" through the bandpass filter BPF 57 and the amplifier 58.

On the other hand, if and when the baseband signal "c" is applied to the MUSE decoder 70 by the switch 30, the baseband signal "c" is signal-processed by the MUSE decoder 70, so that a video signal and a sound signal are outputted from the MUSE decoder 70.

Figure 8:
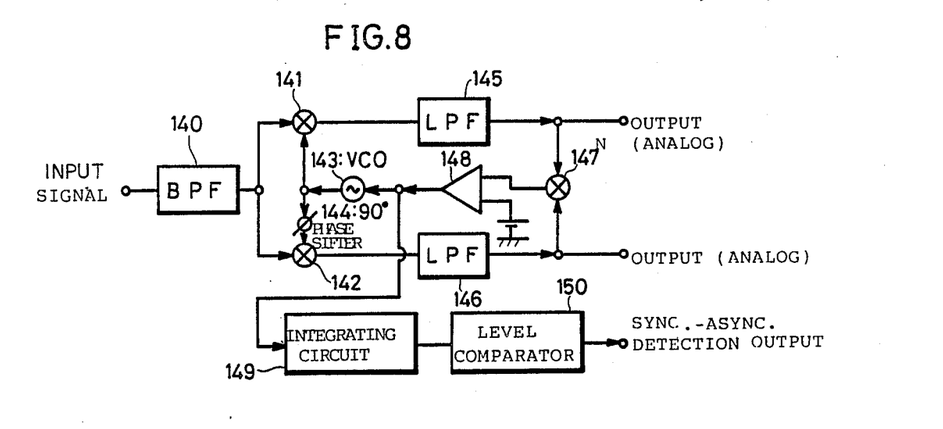
FIG. 8 is a diagram showing a structure of a 4-phase PSK demodulator, which can be applied to a determining circuit.

FIG. 8 is a diagram showing one example of a 4-phase PSK (Phase Shift Keying) demodulator. In FIG. 8, an output of a bandpass filter 140 and an output of a voltage controlled oscillator 143 are applied to a mixer 141. In addition, an output of the bandpass filter 140 and an output of the voltage controlled oscillator 143 are applied to a mixer 142 through a 90° phase shifter 144. An output of the mixer 141 is applied to a low-pass filter 145, and an output of the mixer 142 is applied to a low-pass filter 146. Demodulated signals (analogue signals) are outputted from the low-pass filters 145 and 146. Outputs of the low-pass filters 145 and 146 are applied to a phase comparator 147, where phases of each signal are compared with each other. An output of the phase comparator 147 is applied to an amplifier 148. An output of the amplifier 148 is applied to the voltage controlled oscillator 143 as a control signal for controlling an oscillation frequency of the voltage controlled oscillator 143. When the output of the bandpass filter 140 is synchronized with the output of the voltage controlled oscillator 143, a control signal of a predetermined level is outputted from the amplifier 148. On the other hand, when the output of the bandpass filter 140 is not synchronized with the output of the voltage controlled oscillator 143, the level of the control signal outputted from the amplifier 148 is shifted from the above described predetermined level. When the inputted signal does not include a sound carrier, the output of the bandpass filter 140 is not synchronized with the output of the voltage controlled oscillator 143. Thus, the output of the amplifier 148 is applied to a level comparator 150 through an integrating circuit 149. The level comparator 150 compares an output of the integrating circuit 149 with a predetermined voltage level, to output the result of comparison. The presence or absence of the sound subcarrier can be determined by using an output of the level comparator 150 as the determination signal "s" shown in FIG. 7. In this case, the mixers 141 and 142, the voltage controlled oscillator 143, the 90° phase shifter 144, the low-pass filters 145 and 146, the phase comparator 147 and the amplifier 148 constitute a sound carrier reproducing apparatus, and the integrating circuit 149 and the level comparator 150 constitute an out-of-synchronization detecting circuit.

Figure 9:
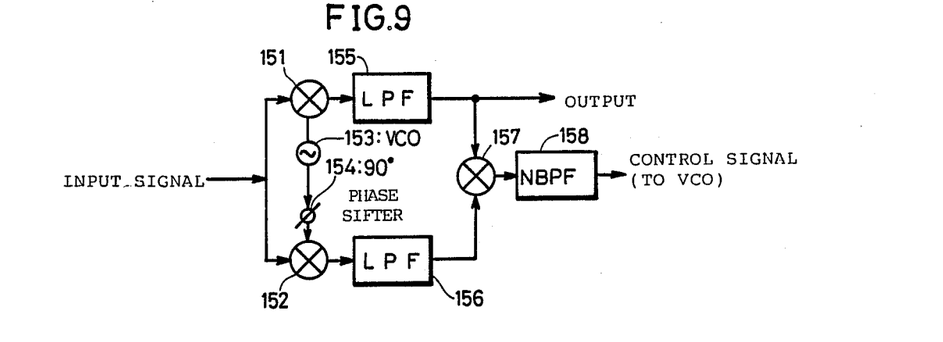
FIG. 9 is a diagram showing a structure of a sound subcarrier reproducing apparatus, which can be applied to the determining circuit.

FIG. 9 is a diagram showing another example of a structure of the sound carrier reproducing apparatus.

The sound carrier reproducing apparatus comprises mixers 151 and 152, a voltage controlled oscillator 153, a 90° phase shifter 154, low-pass filters 155 and 156, a phase comparator 157 and a narrow-band filter 158. In this sound carrier reproducing apparatus, an output of the narrow-band filter 158 is used as a control signal for controlling an oscillation frequency of the voltage controlled oscillator 153, as well as the determination signal "s" shown in FIG. 7.

Description is now made of an operation of the tuner 1 that occurs when satellite broadcasting in the NTSC system is received and an operation of the tuner 1 that occurs when satellite broadcasting in the MUSE system is received, respectively.

First, when the received television signal is a television signal in the NTSC system, a sound carrier signal exists in the received television signal, so that a determination signal "s" of, for example, a high level indicating that the received television signal is a television signal in the standard system is outputted from the determining circuit 10. As a result, the AFC circuit switching switch 20 and the signal processing circuit switching switch 30 are respectively switched to the sides of the terminals A. Consequently, the averaging AFC 21 is selected as an AFC circuit. In addition, the baseband signal "c" is applied to the signal processing circuit 40 for video and the signal processing circuit 50 for sound through the amplifier 31, so that corresponding signal processing is performed. The video signal "d" outputted from the signal processing circuit 40 for video is sent to the NTSC display 60 shown in FIG. 6. Furthermore, the sound signal "e" outputted from the signal processing circuit 50 for sound is sent to a sound demodulating system (not shown).

On the other hand, when the received television signal is a television signal in the MUSE system, the sound carrier signal does not exist in the received television signal, so that a determination signal "s" of, for example, a low level indicating that the received television signal is a television signal in the time division multiplex system is outputted from the determining circuit 10. As a result, the AFC circuit switching switch 20 and the signal processing circuit switching switch 30 are respectively switched to the sides of the terminals B. Consequently, the keyed AFC 22 controlled by the key pulse "p" from the MUSE decoder 70 is selected as the AFC circuit. In addition, the baseband signal "c" is applied to the MUSE decoder 70 through the amplifiers 71 and 72. The video signal obtained by signal processing in the MUSE decoder 70 is sent to the MUSE display 80 shown in FIG. 6. Furthermore, the sound signal obtained by signal processing in the MUSE decoder 70 is sent to a sound demodulating system (not shown).

As described above, in the two-system tuner according to the above described embodiment, the system of the received television signal is determined, so that an AFC circuit and a signal processing circuit corresponding to the result of the determination can be automatically selected. As a result, the television signals in the two different systems can be selectively received by one tuner.

Although in the above described embodiment, the sound carrier reproducing apparatus 14 including the out-of-synchronization detecting circuit is employed as determining means for determining the system of the television signal, the sound carrier reproducing apparatus 14 may be replaced with a sound carrier synchronizing apparatus, to obtain the same effect.

Figure 10:
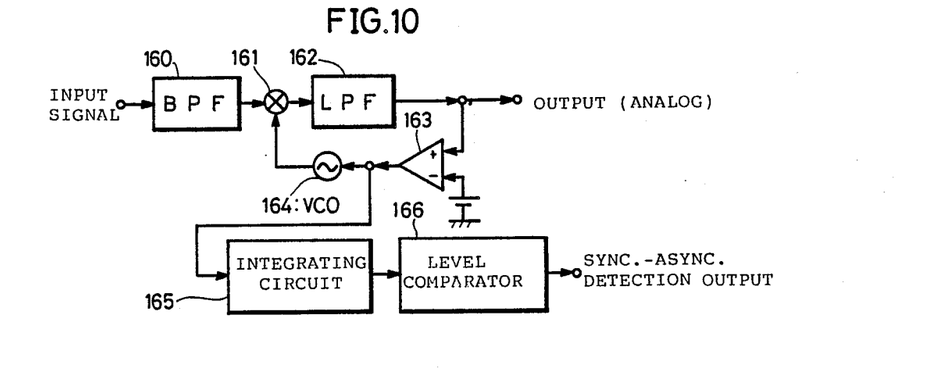
FIG. 10 is a diagram showing a structure of an FM or FSK demodulator, which can be applied to the determining circuit.

FIG. 10 is a diagram showing a structure of an FM (Frequency Modulation) or FSK (Frequency Shift Keying) demodulator which can be applied to the sound carrier synchronizing apparatus.

This demodulator comprises a bandpass filter 160, a mixer 161, a low-pass filter 162, an amplifier 163, a voltage controlled amplifier 164, an integrating circuit 165, and a level comparator 166. Also in this demodulator, the presence or absence of a sound carrier can be determined by using an output of the level comparator 166 as a determination signal "s", as in the demodulator shown in FIG. 8.

Thus, the determination whether or not a carrier exists is made utilizing the fact that a control voltage fed back to a voltage controlled oscillator included in a PLL (Phase Locked Loop) in the demodulator is converged within a constant range with a lapse of time as the PLL is synchronized with the carrier. More specifically, the presence or absence of the carrier is determined based on whether or not this convergence is achieved.

Also in the case of the DSB (Double Side Band) system and the VSB (Vestigial Side Band) system other than the FM system, the PSK system and the FSK system, the presence or absence of the carrier can be determined in the same manner.

Additionally, in the case of the PCM (Pulse Code Modulation) system, the structure of the digital signal has a constant rule. Thus, after the demodulated output (analogue output) shown in FIG. 8 or 10 is converted into a digital signal, it may be determined whether or not synchronization of signals is achieved in the PCM decoder.

Additionally, although in the above described embodiment, the two-system tuner according to the present invention is applied to the television receiver capable of receiving the television signal in the NTSC system and the television signal in the MUSE system, the two-system tuner according to the present invention can be applied to a television receiver capable of receiving a television signal in the other standard system (frequency division multiplex system) and a television signal in the other time division multiplex system.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A single tuner for receiving a first television signal in which a sound signal is multiplexed on a video signal in a frequency-divisional manner which includes a carrier and a second television signal in which a sound signal and a video-signal are multiplexed in a time-divisional manner which does not include a carrier, comprising:
   first signal processing means for signal-processing the first television signal to detect the sound signal and the video signal included therein;
   second signal processing means for signal-processing the sound television signal to detect the sound signal and the video signal included therein;
   determining means for determining whether or not a received television signal includes the carrier; and
   first switching means for applying said received television signal to said first signal processing means in response to the determination by said determining means that the received television signal includes the carrier and for applying the received television signal to said second signal processing means in response to the determination by said determining means that the received television signal does not include the carrier.

2. The tuner as claimed in claim 1, further comprising:
   first automatic frequency adjusting means for maintaining a frequency of the first television signal constant; and
   second automatic frequency adjusting means for maintaining a frequency of the second television signal constant;
   said first automatic frequency adjusting means carrying out corresponding frequency adjustment with respect to the received television signal in response to the determination by said determining means that the received television signal includes the carrier;
   said second automatic frequency adjusting means carrying out corresponding frequency adjustment with respect to the received television signal in response to the determination by said determining means that the received television signal does not include the carrier.

3. The tuner as claimed in claim 1, wherein said determining means comprises:
   out-of-synchronization detecting means for receiving the received television signal and a predetermined synchronizing signal and for detecting when the received television signal is not synchronized with said predetermined synchronizing signal, thereby detecting when the received television signal does not include the carrier.

4. The tuner as claimed in claim 1, wherein said determining means comprises:
   out-of-synchronization detecting means for receiving the received television signal and a predetermined synchronization signal and for detecting when the received television signal is synchronized with said predetermined synchronizing signal, thereby detecting when the received television signal includes the carrier.

5. The tuner as claimed in claim 1, further comprising:
   converting means for making channel selection for the received television signal and for converting the channel-selected television signal into a predetermined intermediate frequency signal; and
   FM demodulating means for FM-demodulating said intermediate frequency signal to a baseband signal and for applying said baseband signal to said determining means and said first switching means.

6. The tuner as claimed in claim 2, further comprising:
   converting means for making channel selection for the received television signal and for converting the channel-selected television signal into a predetermined intermediate frequency signal; and
   FM demodulating means for FM-demodulating said intermediate frequency signal to a baseband signal and for applying said baseband signal to said determining means and said first switching means;
   said first automatic frequency adjusting means adjusting the frequency of the received television signal in said converting means based on said baseband signal from said FM demodulating means in response to the determination by said determining means that the received television signal includes the carrier;
   said second automatic frequency adjusting means adjusting the frequency of the received television signal in said converting means based on said baseband signal from said FM demodulating means in response to the determination by said determining means that the received television signal does not include the carrier.

7. The tuner as claimed in claim 6, further comprising:
   second switching means for coupling said first automatic frequency adjusting means to said converting means in response to the determination by said determining means that the received television signal includes the carrier and for coupling said second automatic frequency adjusting means to said converting means in response to the determination by said determining means that the received television signal does not include the carrier.

8. The tuner as claimed in claim 2, wherein said determining means comprises:
filter means for extracting the sound signal included in the received television signal.

9. The tuner as claimed in claim 5, wherein said determining means comprises:
filter means for extracting the sound signal from said baseband signal applied from said FM demodulating means.

10. The tuner as claimed in claim 2, wherein
said first automatic frequency adjusting means including an averaging automatic frequency adjusting circuit; and
said second automatic frequency adjusting means including a keyed automatic frequency adjusting circuit.

11. A system for receiving a frequency-divisional multiplexed television signal or a time-divisional multiplexed television signal, comprising:
receiving means for receiving a television signal, said television signal being either a frequency-divisional multiplexed television signal or a time-divisional multiplexed television signal;
determining means, operatively connected to said receiving means, for determining when the received television signal is said frequency-divisional multiplexed television signal and for outputting a determining signal indicative thereof;
first signal-processing means, operatively connected to said receiving means, for signal-processing said frequency-divisional multiplexed television signal;
second signal-processing means, operatively connected to said receiving means, for signal-processing said time-divisional multiplexed television signal; and
switching means, operatively connected to said determining means and said receiving means, for applying the received television signal to said first signal-processing means, in response to said determining signal, when the received television signal is said frequency-divisional multiplexed television signal.

12. The system as claimed in claim 11, wherein
said switching means applies the received television signal to said second signal-processing means, in response to said determining signal, when the received television signal is said time-divisional multiplexed television signal.

13. The system as claimed in claim 11, wherein said receiving means comprises:
first automatic frequency adjusting means for maintaining a frequency of said frequency-divisional multiplexed television signal constant by frequency adjustment; and
second automatic frequency adjusting means for maintaining a frequency of said time-divisional multiplexed television signal constant by frequency adjustment.

14. The system as claimed in claim 11, wherein said determining means comprises:
sync detecting means for detecting when the received television signal is not synchronized with a predetermined synchronizing signal, thereby detecting that the received television signal is said time-divisional multiplexed television signal.

15. The system as claimed in claim 11, wherein said determining means comprises:
sync detecting means for detecting when the received television signal is synchronized with a predetermined synchronizing signal, thereby detecting that the received television signal is said frequency-divisional multiplexed television signal.

16. The system as claimed in claim 13, further comprising:
converting means for channel selecting the received television signal and for converting the channel-selected television signal into a predetermined intermediate frequency signal; and
FM-demodulating means, operatively connected to said converting means, for FM-demodulating said intermediate frequency to a baseband signal; and
said FM-demodulating means applying said baseband signal to said determining means and said switching means.

17. The system as claimed in claim 16, further comprising:
coupling means for coupling said first automatic frequency adjusting means to said converting means when the received television signal is said frequency-divisional multiplexed television signal;
said coupling means coupling said second automatic frequency adjusting means to said converting means when the received television signal is said time-divisional multiplexed television signal.

18. The system as claimed in claim 12, wherein said determining means comprises:
filter means for extracting a sound signal from the received television signal.

19. The system as claimed in claim 16, wherein said determining means comprises:
filter means for extracting a sound signal from said baseband signal.

20. The system as claimed in claim 13, wherein
said first automatic frequency adjusting means including an average automatic frequency adjusting circuit; and
said second automatic frequency adjusting means including a keyed automatic frequency adjusting circuit.

21. A method for receiving and processing either a frequency-divisional multiplexed television signal or a time-divisional multiplexed television signal using a single tuner, comprising the steps of:
(a) receiving a television signal;
(b) determining if the received television signal is a frequency-divisional multiplexed television signal;
(c) signal processing the received television signal in a first signal-processing circuit when said step (b) determines that the received television signal is a frequency-divisional multiplexed television signal; and
(d) signal-processing the received television signal in a second signal-processing circuit when said step (b) determines that the received television signal is not a frequency-divisional multiplexed television signal.

22. The method as claimed in claim 21, wherein said step (b) comprises the steps of:
(e) producing a predetermined synchronizing signal;

(f) detecting when the received television signal is synchronized with the predetermined synchronizing signal; and
(g) determining that the received television signal is a frequency-divisional multiplexed television signal when said step (f) detects synchronization between the predetermined synchronizing signal and the received television signal.

23. The method as claimed in claim 21, wherein said step (b) comprises the step of:
(e) extracting a sound signal from the received television signal.

* * * * *